(12) United States Patent
Kawakita et al.

(10) Patent No.: US 11,938,511 B2
(45) Date of Patent: *Mar. 26, 2024

(54) COATING METHOD, COATING APPARATUS AND RECORDING MEDIUM

(71) Applicant: Tokyo Electron Limited, Tokyo (JP)

(72) Inventors: Masatoshi Kawakita, Koshi (JP); Yusaku Hashimoto, Koshi (JP); Kosuke Yoshihara, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/809,947

(22) Filed: Jun. 30, 2022

(65) Prior Publication Data

US 2022/0323990 A1   Oct. 13, 2022

Related U.S. Application Data

(63) Continuation of application No. 16/869,664, filed on May 8, 2020, now Pat. No. 11,407,005.

(30) Foreign Application Priority Data

May 9, 2019 (JP) ................................. 2019-089243

(51) Int. Cl.
*B05D 1/00* (2006.01)
*B05C 5/02* (2006.01)
*B05D 3/10* (2006.01)

(52) U.S. Cl.
CPC ................ *B05D 1/005* (2013.01); *B05C 5/02* (2013.01); *B05D 3/10* (2013.01)

(58) Field of Classification Search
None
See application file for complete search history.

(56) References Cited

U.S. PATENT DOCUMENTS

| | | | |
|---|---|---|---|
| 11,407,005 B2 * | 8/2022 | Kawakita | ............... B05C 5/02 |
| 2004/0265493 A1 | 12/2004 | Mizuno et al. | |
| 2008/0057194 A1 | 3/2008 | Tanaka | |
| 2011/0305912 A1 | 12/2011 | Teer et al. | |
| 2018/0021804 A1 | 1/2018 | Hashimoto et al. | |

FOREIGN PATENT DOCUMENTS

| | | |
|---|---|---|
| JP | H08-173884 A | 7/1996 |
| JP | 2012-238838 A | 12/2012 |
| JP | 2014-151249 A | 8/2014 |
| JP | 2017-094324 A | 6/2017 |

* cited by examiner

*Primary Examiner* — Shamim Ahmed
*Assistant Examiner* — Bradford M Gates
(74) *Attorney, Agent, or Firm* — Pearne & Gordon LLP

(57) ABSTRACT

A coating method includes supplying a film forming liquid onto a center of a front surface of a substrate from a nozzle in a state that a distance between the front surface and the nozzle is maintained at a coating distance; rotating the substrate at a first rotation speed in a period during which the film forming liquid is supplied onto the front surface, to allow the film forming liquid to be diffused toward an edge of the substrate from an outer periphery of the nozzle; and rotating the substrate at a second rotation speed after the supplying of the film forming liquid is stopped, to allow the film forming liquid to be further diffused. The coating distance is set to allow the film forming liquid to be kept between the nozzle and the front surface when a discharge of the film forming liquid is stopped.

5 Claims, 11 Drawing Sheets

*FIG. 8A*
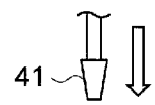
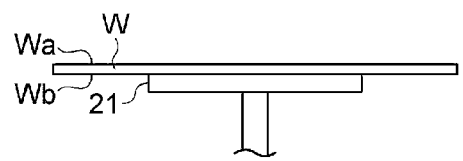
*FIG. 8B*
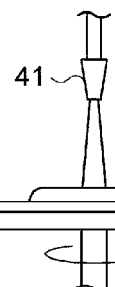
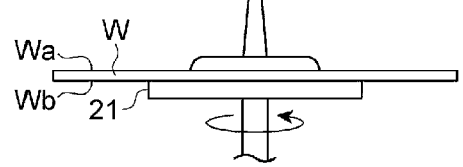
*FIG. 8C*
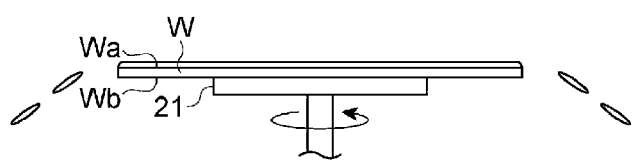

COATING METHOD, COATING APPARATUS AND RECORDING MEDIUM

CROSS-REFERENCE TO RELATED APPLICATION

This is a continuation application of U.S. patent application Ser. No. 16/869,664, filed on May 8, 2020, which claims the benefit of Japanese Patent Application No. 2019-089243 filed on May 9, 2019, the entire disclosures of which are incorporated herein by reference.

TECHNICAL FIELD

The various aspects and embodiments described herein pertain generally to a coating method, a coating apparatus and a recording medium.

BACKGROUND

Patent Document 1 describes a coating apparatus including a substrate holder configured to hold a substrate; a rotator configured to rotate the substrate held by the substrate holder; a supply configured to supply a coating liquid onto a front surface of the substrate held by the substrate holder; and an air flow control plate provided at a preset position above the substrate held by the substrate holder and configured to locally change, at a certain position, an air flow above the substrate being rotated by the rotator.
Patent Document 1: Japanese Patent Laid-open Publication No. 2012-238838

SUMMARY

In one exemplary embodiment, a coating method includes supplying a film forming liquid onto a center of a front surface of a substrate from a nozzle in a state that a distance between the front surface of the substrate and the nozzle is maintained at a coating distance; rotating the substrate at a first rotation speed around an axis, which passes through the center of the front surface of the substrate, in a period during which the film forming liquid is supplied onto the front surface of the substrate from the nozzle, to allow the film forming liquid to be diffused toward an edge of the substrate from an outer periphery of the nozzle by a centrifugal force; and rotating the substrate at a second rotation speed around the axis after the supplying of the film forming liquid onto the front surface of the substrate from the nozzle is stopped, to allow the film forming liquid to be further diffused by a centrifugal force. The coating distance is set to allow the film forming liquid to be kept between the nozzle and the front surface of the substrate when a discharge of the film forming liquid from the nozzle is stopped.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 8A to FIG. 8C are schematic diagrams illustrating states of a wafer when a pre-wet liquid is coated.

DETAILED DESCRIPTION

Figure 1:
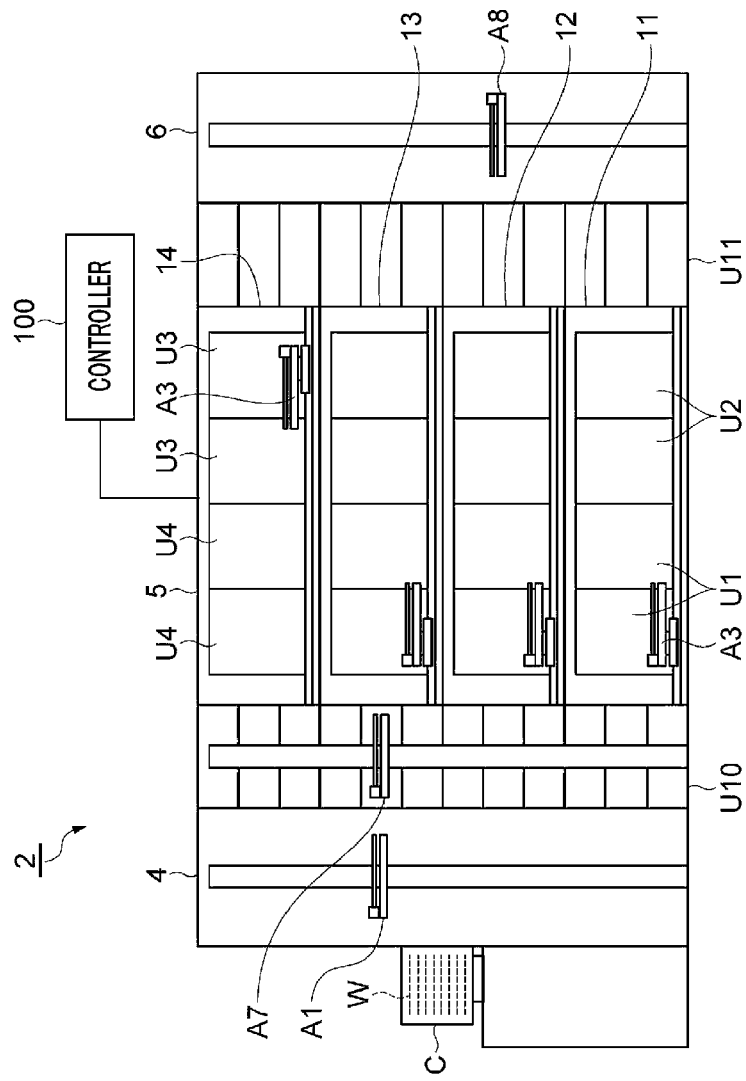
FIG. 1 is a diagram illustrating a schematic configuration of a liquid processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

[Substrate Processing System]

A substrate processing system 1 is a system configured to perform formation of a photosensitive film on a substrate, exposure of the photosensitive film and development of the photosensitive film. The substrate as a processing target object is, for example, a semiconductor wafer W. The photosensitive film is, by way of example, a resist film. The substrate processing system 1 includes a coating and developing apparatus 2 and an exposure apparatus 3. The exposure apparatus 3 is configured to perform an exposure processing of the resist film (photosensitive film) formed on the wafer W (substrate). To elaborate, the exposure apparatus 3 irradiates an energy beam to an exposure target portion of the resist film by an immersion lithography or the like. The coating and developing apparatus 2 is configured to perform a processing of forming the resist film on a front surface of the wafer W (substrate) prior to the exposure processing by the exposure apparatus 3, and then to perform a developing processing on the resist film after the exposure processing.

<Coating Apparatus>

Hereinafter, a configuration of the coating and developing apparatus 2 as an example of a coating apparatus will be described. As depicted in FIG. 1, the coating and developing apparatus 2 is equipped with a carrier block 4, a processing block 5, an interface block 6 and a controller 100.

The carrier block 4 is configured to carry a wafer W into/from the coating and developing apparatus 2. For example, the carrier block 4 is configured to support a plurality of carriers C for wafers W and incorporates therein a delivery arm A1. Each carrier C accommodates therein, for example, a multiple number of circular wafers W. The delivery arm A1 is configured to take out a wafer W from the carrier C, hand the wafer W over to the processing block 5, receive the wafer W from the processing block 5 and return the wafer W back into the carrier C.

The processing block 5 includes multiple processing modules 11, 12, 13 and 14. Each of the processing modules 11, 12 and 13 incorporates coating units U1, heat treatment units U2 and a transfer arm A3 configured to transfer the wafer W into these units.

The processing module 11 is configured to form a bottom film on the surface of the wafer W by the coating unit U1 and the heat treatment unit U2. The coating unit U1 of the processing module 11 is configured to coat a film forming liquid for forming the bottom film on the wafer W. The heat treatment unit U2 of the processing module 11 is configured to perform various kinds of heat treatments required to form the bottom film.

The processing module 12 is configured to form a resist film on the bottom film by the coating unit U1 and the heat treatment unit U2. The coating unit U1 of the processing module 12 is configured to coat a film forming liquid for forming a resist film (hereinafter, referred to as "resist liquid") on the bottom film. The heat treatment unit U2 of the processing module 12 is configured to perform various kinds of heat treatments required to form the resist film.

The processing module 13 is configured to form a top film on the resist film by the coating unit U1 and the heat treatment unit U2. The coating unit U1 of the processing module 13 is configured to coat a film forming liquid for forming the top film on the resist film. The heat treatment unit U2 of the processing module 13 is configured to perform various kinds of heat treatments required to form the top film.

The processing module 14 incorporates therein developing units U3, heat treatment units U4, and a transfer arm A3 configured to transfer the wafer W into these units.

The processing module 14 is configured to perform a developing processing of the exposed resist film by the developing unit U3 and the heat treatment unit U4. The developing unit U3 is configured to perform the developing processing of the resist film by coating a developing liquid on the surface of the exposed wafer W and washing it with a rinse liquid. The heat treatment unit U4 is configured to perform various kinds of heat treatments required for the developing processing. Specific examples of these heat treatments include a heat treatment (PEB: Post Exposure Bake) performed before the developing processing, a heat treatment (PB: Post Bake) performed after the developing processing, and so forth.

Within the processing block 5, a shelf unit U10 is provided at a side of the carrier block 4. The shelf unit U10 is partitioned into a multiple number of cells arranged in the vertical direction. An elevation arm A7 is provided in the vicinity of the shelf unit U10. The elevation arm A7 is configured to move the wafer W up and down among the cells of the shelf unit U10.

Within the processing block 5, a shelf unit U11 is provided at a side of the interface block 6. The shelf unit U11 is partitioned into multiple cells which are arranged in the vertical direction.

The interface block 6 is configured to deliver the wafer W into/from the exposure apparatus (not shown). By way of example, the interface block 6 incorporates a delivery arm A8 and is connected to the exposure apparatus 3. The delivery arm A8 is configured to deliver the wafer W placed in the shelf unit U11 to the exposure apparatus 3, and receives the wafer W from the exposure apparatus 3 and returns the received wafer W back into the shelf unit U11.

The controller 100 controls the coating and developing apparatus 2 to perform a coating and developing processing according to the following sequence, for example. First, the controller 100 controls the delivery arm A1 to transfer the wafer W within the carrier C to the shelf unit U10, and controls the elevation arm A7 to place this wafer W in the cell for the processing module 11.

Then, the controller 100 controls the transfer arm A3 to transfer the wafer W of the shelf unit U10 into the coating unit U1 and the heat treatment unit U2 within the processing module 11, and controls the coating unit U1 and the heat treatment unit U2 to form the bottom film on the surface of the wafer W. Thereafter, the controller 100 controls the transfer arm A3 to return the wafer W having the bottom film formed thereon back into the shelf unit U10, and then controls the elevation arm A7 to place this wafer W in the cell for the processing module 12.

Subsequently, the controller 100 controls the transfer arm A3 to transfer the wafer W of the shelf unit U10 into the coating unit U1 and the heat treatment unit U2 within the processing module 12, and controls the coating unit U1 and the heat treatment unit U2 to form the resist film on the bottom film of the wafer W. Thereafter, the controller 100 controls the transfer arm A3 to return the wafer W back into the shelf unit U10, and controls the elevation arm A7 to place this wafer W in the cell for the processing module 13.

Afterwards, the controller 100 controls the transfer arm A3 to transfer the wafer W of the shelf unit U10 to the respective units within the processing module 13 and controls the coating unit U1 and the heat treatment unit U2 to form the top film on the resist film of the wafer W. Then, the controller 100 controls the transfer arm A3 to transfer the wafer W to the shelf unit U11.

Thereafter, the controller 100 controls the delivery arm A8 to deliver the wafer W of the shelf unit U11 to the exposure apparatus. Then, the controller 100 controls the delivery arm A8 to receive from the exposure apparatus the wafer W on which the exposure processing is already performed and return the received wafer W in the cell within the shield unit U11 for the processing module 14.

Thereafter, the controller 100 controls the transfer arm A3 to transfer the wafer W of the shelf unit U11 into the respective units within the processing module 14, and controls the developing unit U3 and the heat treatment unit U4 to perform the developing processing on the resist film of the wafer W. Then, the controller 100 controls the transfer arm A3 to return the wafer W to the shelf unit U10, and controls the elevation arm A7 and the delivery arm A1 to return this wafer W back into the carrier C. Then, the coating and developing processing is ended.

A specific configuration of the substrate processing apparatus is not limited to the above-described configuration of the coating and developing apparatus 2. The substrate processing apparatus may be implemented by any of various types of apparatuses as long as it is equipped with the coating unit U1 and the controller 100 configured to control this coating unit U1.

<Coating Unit>

Figure 2:
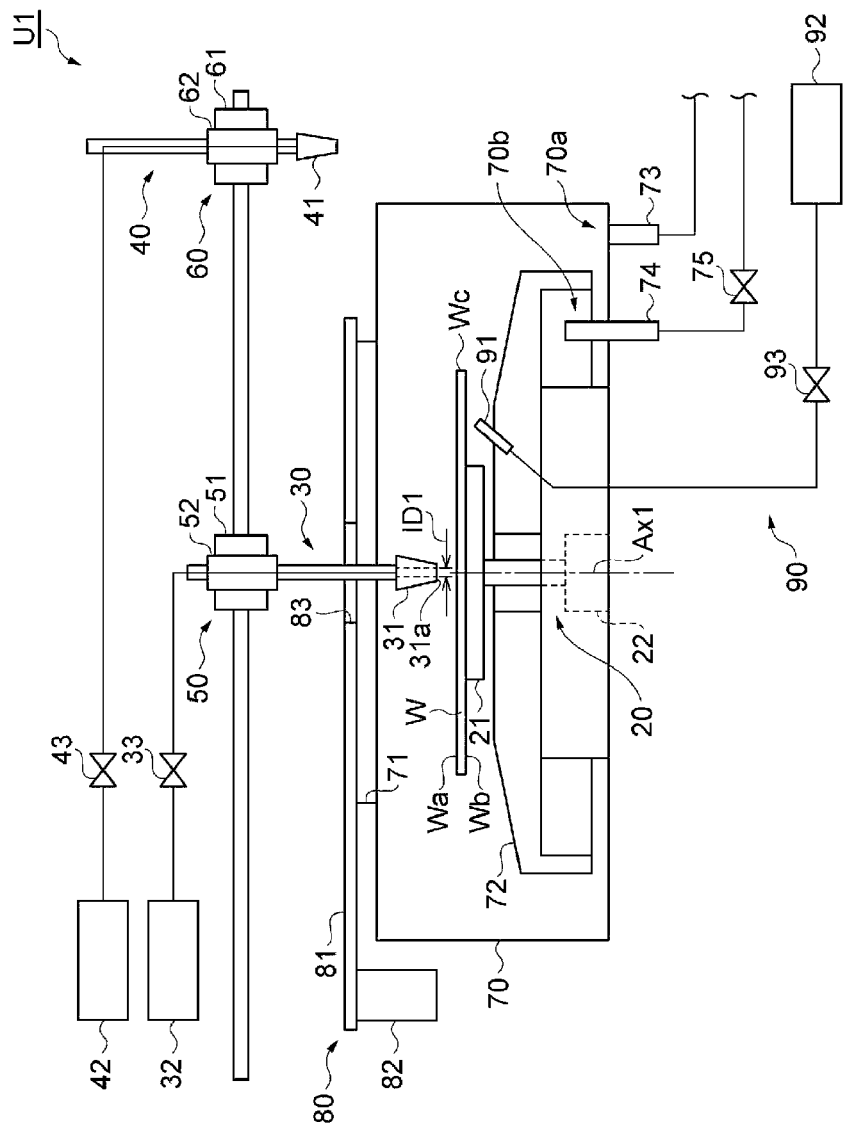
FIG. 2 is a diagram illustrating a schematic configuration of a coating unit.

Now, a configuration of the coating unit U1 provided in the processing module 12 will be elaborated. As depicted in FIG. 2, the coating unit U1 includes a rotating holder 20, liquid supplies 30 and 40, nozzle transfer devices 50 and 60, a cup 70, an opening/closing unit 80 and a cooler 90.

The rotating holder 20 is configured to hold the wafer W from a rear surface Wb side thereof and rotate the wafer W. By way of example, the rotating holder 20 is equipped with a holder 21 and a rotation driver 22. The holder 21 is configured to support a central portion (a portion including a center) of the wafer W, which is horizontally placed thereon with a front surface Wa facing upwards, from the rear surface Wb side thereof, and configured to hold the wafer W by, for example, vacuum attraction. The rotation driver 22 is configured to rotate the holder 21 around a vertical axis Ax1, which passes through the center of the wafer W, by using, for example, an electric motor as a power source. Accordingly, the wafer W is also rotated.

The liquid supply 30 is configured to supply the resist liquid onto the front surface Wa of the wafer W held by the holder 21. By way of example, the liquid supply 30 supplies the resist liquid having a viscosity equal to or less than 5 cP onto the front surface Wa of the wafer W. By way of non-limiting example, the liquid supply 30 includes a nozzle 31, a liquid source 32 and a valve 33. The nozzle 31 is configured to discharge the resist liquid downwards. The liquid source 32 supplies the resist liquid to the nozzle 31. By way of example, the liquid source 32 includes a tank configured to store the resist liquid therein, a pump configured to force-feed the resist liquid, and so forth. The valve 33 serves to open/close a flow path for the resist liquid from the liquid source 32 to the nozzle 31. The valve 33 may be configured to be capable of adjusting a degree of openness of the flow path for the resist liquid. With this configuration, a discharge amount of the resist liquid from the nozzle 31 can be adjusted.

The liquid supply 40 is configured to supply a pre-wet liquid onto the front surface Wa of the wafer W held by the holder 21. By way of example, the liquid supply 40 supplies an organic solvent such as a thinner onto the front surface Wa of the wafer W. By way of non-limiting example, the liquid supply 40 includes a nozzle 41, a liquid source 42 and a valve 43. The nozzle 41 is configured to discharge the pre-wet liquid downwards. The liquid source 42 supplies the pre-wet liquid to the nozzle 41. For example, the liquid source 42 includes a tank configured to store the pre-wet liquid therein, a pump configured to force-feed the pre-wet liquid, and so forth. The valve 43 serves to open/close a flow path for the pre-wet liquid from the liquid source 42 to the nozzle 41. The valve 43 may be configured to be capable of adjusting a degree of openness of the flow path for the pre-wet liquid. With this configuration, a discharge amount of the pre-wet liquid form the nozzle 41 can be adjusted.

The nozzle transfer device 50 is configured to transfer the nozzle 31 of the liquid supply 30. By way of example, the nozzle transfer device 50 includes a horizontal transfer unit 51 and an elevating unit 52. The horizontal transfer unit 51 is configured to transfer the nozzle 31 along a horizontal transfer line by using, for example, an electric motor as a power source. The elevating unit 52 is configured to move the nozzle 31 up and down by using, for example, an electric motor as a power source.

The nozzle transfer device 60 is configured to transfer the nozzle 41 of the liquid supply 40. By way of example, the nozzle transfer device 60 includes a horizontal transfer unit 61 and an elevating unit 62. The horizontal transfer unit 61 is configured to transfer the nozzle 41 along a horizontal transfer line by using, for example, an electric motor as a power source. The elevating unit 62 is configured to move the nozzle 41 up and down by using, for example, an electric motor as a power source.

The cup 70 is configured to accommodate the wafer W and the holder 21 therein and configured to receive various kinds of processing liquids (for example, the resist liquid and the pre-wet liquid) scattered from the wafer W. The cup 70 has, at a top portion thereof, an opening 71 for carry-in/out of the wafer W. Further, the cup 70 has an umbrella-shaped portion 72, a drain portion 73, an exhaust portion 74 and an exhaust valve 75. The umbrella-shaped portion 72 is provided under the holder 21 and guides the various processing liquids scattered from the wafer W down to a drain region 70a at an outer peripheral side within the cup 70. The drain portion 73 is provided under the umbrella-shaped portion 72 within the drain region 70a, and the processing liquids guided into the drain region 70a by the umbrella-shaped portion 72 is drained to an outside of the cup 70 through this drain portion 73. The exhaust portion 74 is provided under the umbrella-shaped portion 72 within an exhaust region 70b at an inner side than the drain region 70a, and a gas within the cup 70 is exhausted to the outside of the cup 70 through this exhaust portion 74. The exhaust valve 75 is configured to open/close an exhaust path for the gas through the exhaust portion 74.

The opening/closing unit 80 is configured to open/close the opening 71 of the cup 70. By way of example, the opening/closing unit 80 includes a cover member 81 and an opening/closing driver 82. The cover member 81 is a plate-shaped member configured to close the opening 71. The cover member 81 has a nozzle insertion opening 83 for allowing the nozzle 31 to be inserted therethrough, and this nozzle insertion opening 83 is provided at a position facing the central portion (including the center) of the front surface Wa of the wafer W (held by the holder 21) when the cover member 81 closes the opening 71. The opening/closing driver 82 is configured to move the cover member 81 between a closing position where the cover member 81 closes the opening 71 and an opening position where the cover member 81 opens the opening 71 by using, for example, an electric motor as a power source.

The cooler 90 is configured to cool at least a part of the wafer W held by the holder 21. By way of example, the cooler 90 cools an annular region of the wafer W at an outer side than a region of the wafer W held by the holder 21. For example, the cooler 90 is configured to supply a cooling liquid to the rear surface Wb of the wafer W. As an example, the cooler 90 includes a nozzle 91, a liquid source 92 and a valve 93. The cooling liquid may be, by way of example, but not limitation, a volatile solvent such as isopropyl alcohol (IPA), a thinner or acetone.

The nozzle 91 is provided near the holder 21 and discharges the cooling liquid toward the rear surface Wb of the wafer W held by the holder 21. If the cooling liquid is supplied to the rear surface Wb from the nozzle 91 while the wafer W is being rotated by the rotating holder 20, the aforementioned annular region of the wafer W is cooled. A discharging direction of the cooling liquid from the nozzle 91 may be inclined toward an edge Wc of the wafer W. The liquid source 92 is configured to supply the cooling liquid to the nozzle 91. By way of example, the liquid source 92 includes a tank configured to store the cooling liquid therein, a pump configured to force-feed the cooling liquid, and so forth. The valve 93 serves to open/close a flow path for the cooling liquid from the liquid source 92 into the nozzle 91. The valve 93 may be configured to be capable of adjusting a degree of openness of the flow path for the cooling liquid. With this configuration, a discharge amount of the cooling liquid from the nozzle 91 can be adjusted.

Furthermore, the method of cooling the wafer W is not necessarily limited to supplying the cooling liquid to the wafer W. By way of example, the cooler 90 may be configured to discharge a cooling gas to the rear surface Wb of the wafer W from the nozzle 91. Further, the cooler 90 may be configured to cool the wafer W indirectly by cooling the gas within the cup 70.

The coating unit U1 having the above-described configuration is controlled by the controller 100. The controller 100 may be configured to control the liquid supply 30 and the nozzle transfer device 50 to supply the resist liquid onto the center of the front surface Wa of the wafer W from the nozzle 31 in a state that a distance between the front surface Wa of the wafer W and the nozzle 31 is maintained at a preset distance for coating (hereinafter, referred to as "coating distance"); and control the rotating holder 20 to rotate the wafer W at a first rotation speed around the axis Ax1 passing the center of the front surface Wa of the wafer W in a period during which the resist liquid is supplied onto the front surface Wa of the wafer W from the nozzle 31, thus allowing the resist liquid to be diffused to the edge Wc of the wafer W from an outer periphery of the nozzle 31 by a centrifugal force, and to rotate the wafer W at a second rotation speed around the axis Ax1 after the supply of the resist liquid onto the front surface Wa of the wafer W from the nozzle 31 is stopped, thus allowing the resist liquid to be further diffused by a centrifugal force.

Figure 3:
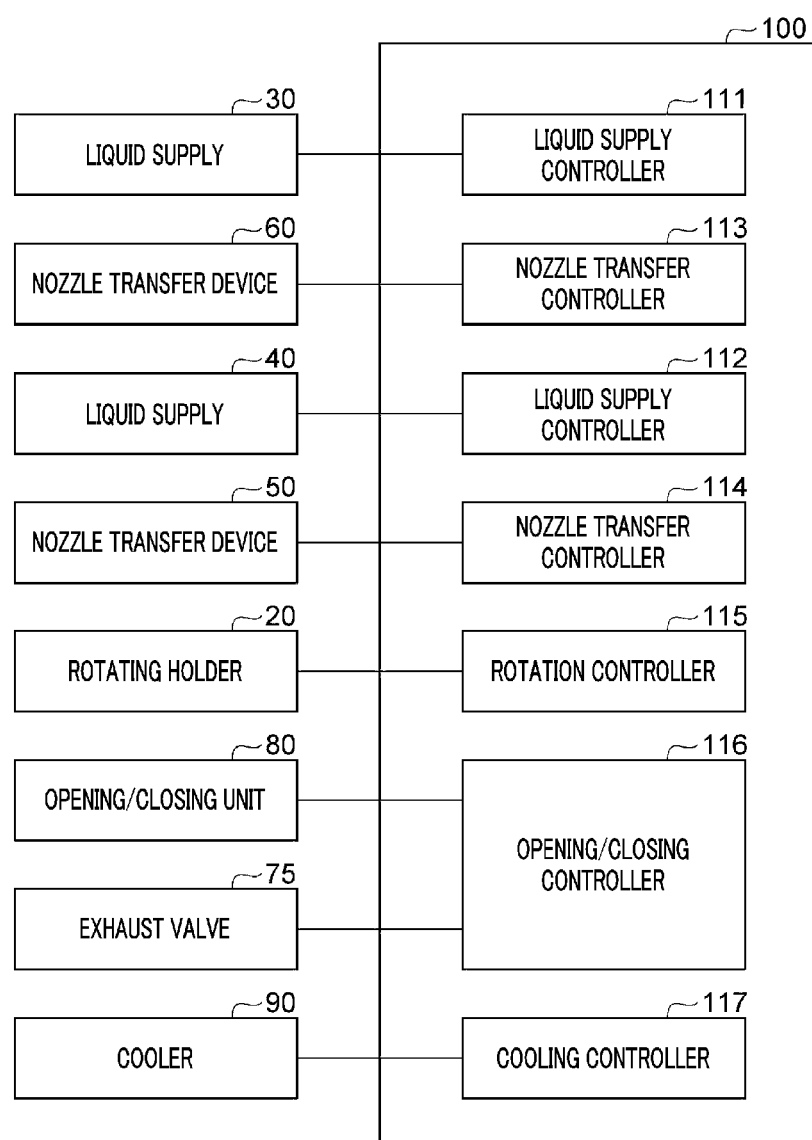
FIG. 3 is a block diagram illustrating a functional configuration of a controller.

As shown in FIG. 3, the controller 100 includes, as functional components (hereinafter, referred to as "functional modules"), a liquid supply controller 111, a liquid supply controller 112, a nozzle transfer controller 113, a nozzle transfer controller 114, a rotation controller 115, an opening/closing controller 116 and a cooling controller 117.

The liquid supply controller 111 controls the liquid supply 30 to supply the resist liquid onto the center of the front wafer Wa of the wafer W from the nozzle 31 in the state that the distance between the front surface Wa of the wafer W and the nozzle 31 is maintained at the aforementioned coating distance. The coating distance is set to keep the resist liquid between the nozzle 31 and the front surface Wa of the wafer W when the discharge of the resist liquid from the nozzle 31 is stopped. Here, the keeping the resist liquid between the nozzle 31 and the front surface Wa of the wafer W means allowing the resist liquid to stay between a lower end surface 31a of the nozzle 31 and the front surface Wa of the wafer W in a state that both the lower end surface 31a and the front surface Wa of the wafer W are in contact with the resist liquid. The coating distance is equal to or less than three times an inner diameter ID1 of the nozzle 31. The coating distance may be equal to or less than twice the inner diameter ID1 of the nozzle 31.

If the coating distance is equal to or less than a thickness of a liquid film of the resist liquid (that is, a liquid film formed on the front surface Wa as a result of the supply of the resist liquid), the resist liquid is kept between the nozzle 31 and the front surface Wa even when the discharge of the resist liquid from the nozzle 31 is stopped. Even if the coating distance is larger than the thickness of the liquid film of the resist liquid, the resist liquid can still be kept between the lower end surface 31a and the front surface Wa since the coating distance is set such that an adhesive strength between the lower end surface 31a and the resist liquid becomes equal to or larger than a weight of the resist liquid. If the coating distance is larger than the thickness of the liquid film of the resist liquid, that is, if the lower end surface 31a is located higher than the liquid film, the resist liquid may be more easily diffused toward an outer periphery of the wafer W from a portion of the wafer W to which the resist liquid adheres. Furthermore, since a region of the lower end surface 31a to which the resist liquid adheres is suppressed to be small, it becomes difficult for the resist liquid to remain at the lower end surface 31a when the supply of the resist liquid is stopped and when the resist liquid is suctioned (sucked back) into the nozzle 31 afterwards.

The coating distance may be set to allow a liquid column of the resist liquid formed between the lower end surface 31a and the front surface Wa to have a narrow portion. That is, the coating distance may be set to allow the resist liquid staying between the lower end surface 31a and the front surface Wa to have a column shape which is gradually enlarged after being once narrowed from the lower end surface 31a side toward the front surface Wa. Thus, as compared to the case where the coating distance is equal to or less than the film thickness of the liquid film, an adhesion region of the resist liquid with respect to the liquid film is reduced. In this case, the adhesion region of the resist film with respect to the liquid film is further reduced.

On the lower end surface 31a of the nozzle 31, a width of an annular portion surrounding the opening may be less than the inner diameter ID1 of the opening. Most of the lower end surface 31a may not be parallel to the front surface Wa. By way of example, the lower end surface 31a may be inclined to be distanced farther from the front surface Wa as it goes toward the outer periphery thereof. Further, the lower end surface 31a may be inclined to be distanced farther from the front surface Wa as it goes toward an inner periphery thereof. Furthermore, the lower end surface 31a may be inclined to be distanced farther from the front surface Wa as it goes both outwards and inwards. That is, a portion of the lower end surface 31a between the outer periphery and the inner periphery may be protruded toward the front surface Wa. Further, the portion of the lower end surface 31a between the outer periphery and the inner periphery may be formed as a curved surface protruding toward the front surface Wa. In any of these cases, the resist liquid adhering to the lower end surface 31a may be easily distanced away from the lower end surface 31a, so that it becomes difficult for the resist liquid to remain at the lower end surface 31a.

The liquid supply controller 111 may control the liquid supply 30 to stop the discharge of the resist liquid from the nozzle 31 before the resist liquid reaches the edge We of the wafer W. A timing when the liquid supply controller 111 stops the discharge of the resist liquid from the nozzle 31 may be set to allow the resist liquid to arrive at a position on the wafer W 0.3 times to 1.0 times (or 0.4 times or 0.8 times) the radius of the wafer W from the center of the wafer W at the corresponding time. The timing when the liquid supply controller 111 stops the discharge of the resist liquid from the nozzle 31 may be set to allow the resist liquid to reach the aforementioned annular region (cooling target region) at the corresponding time. When the resist liquid is supplied onto the front surface Wa of the wafer W from the nozzle 31, the liquid supply controller 111 may control the liquid supply 30 to discharge the resist liquid having the viscosity equal to or less than 5 cP from the nozzle 31 at a flow rate of 0.2 cc per second.

The liquid supply controller 112 may control the liquid supply 40 to supply the pre-wet liquid onto the front surface Wa of the wafer W before the liquid supply controller 111 begins the supply of the resist liquid onto the front surface Wa of the wafer W from the nozzle 31.

The nozzle transfer controller 113 controls the nozzle transfer device 60 to place the nozzle 41 at a position above the center of the wafer W by using the horizontal transfer unit 61 before the pre-wet liquid is supplied onto the front surface Wa of the wafer W from the nozzle 41. Then, the nozzle transfer controller 113 controls the nozzle transfer device 60 to move the nozzle 41 close to the front surface Wa by using the elevating unit 62. After the pre-wet liquid is supplied onto the front surface Wa of the wafer W from the nozzle 41, the nozzle transfer controller 113 controls the nozzle transfer device 60 to move the nozzle 41 away from the front surface Wa by using the elevating unit 62. Thereafter, the nozzle transfer controller 113 controls the nozzle transfer device 60 to retreat the nozzle 41 from above the wafer W by using the horizontal transfer unit 61.

The nozzle transfer controller 114 controls the nozzle transfer device 50 to locate the nozzle 31 at the position above the center of the wafer W by using the horizontal transfer unit 51 before the supply of the resist liquid onto the front surface Wa is performed and after the pre-wet liquid is coated on the front surface Wa of the wafer W. Then, the nozzle transfer controller 114 controls the nozzle transfer device 50 to move the nozzle 31 close to the front surface Wa by using the elevating unit 52 until the distance between the front surface Wa and the nozzle 31 becomes the aforementioned coating distance. Then, after the resist liquid is supplied onto the front surface Wa of the wafer W from the nozzle 31, the nozzle transfer controller 114 controls the nozzle transfer device 50 to move the nozzle 31 away from the front surface Wa by using the elevating unit 52. Thereafter, the nozzle transfer controller 114 controls the nozzle transfer device 50 to retreat the nozzle 31 from above the wafer W by using the horizontal transfer unit 51.

In the period during which the resist liquid is supplied onto the front surface Wa of the wafer W from the nozzle 31, the rotation controller 115 controls the rotating holder 20 to rotate the wafer W at the first rotation speed so that the resist liquid is diffused toward the edge Wc of the wafer W from the outer periphery of the nozzle 31 by the centrifugal force. The first rotation speed is set such that the supply of the resist liquid, which is discharged from the nozzle 31 at the flow rate equal to or less than 0.2 cc per second, onto the edge Wc does not stopped. By way of example, the first rotation speed may be 1000 rpm to 2000 rpm, 1200 rpm to 1800 rpm, or 1400 rpm to 1600 rpm. After the supply of the resist liquid onto the front surface Wa of the wafer W from the nozzle 31 is stopped, the rotation controller 115 controls the rotating holder 20 to rotate the wafer W at the second rotation speed so that the resist liquid is further diffused by the centrifugal force. The second rotation speed is equal or larger than the first rotation speed. By way of non-limiting example, the second rotation speed may be 1300 rpm to 2300 rpm, 1500 rpm to 2100 rpm, or 1700 rpm to 1900 rpm.

The rotation controller 115 may control the rotating holder 20 to decrease the rotation speed of the wafer W to a third rotation speed lower than the first rotation speed before the nozzle 31 is moved away from the front surface Wa and after the discharge of the resist liquid from the nozzle 31 is stopped. In this case, after the nozzle 31 is moved away from the front surface Wa, the rotation controller 115 controls the rotating holder 20 to increase the rotation speed of the wafer W from the third rotation speed to the second rotation speed. By way of non-limiting example, the third rotation speed may be 0 rpm to 200 rpm, 50 rpm to 150 rpm, or 80 rpm to 120 rpm. With this configuration in which the rotation speed of the wafer W is decreased when the nozzle 31 is moved away from the front surface Wa, the nozzle 31 can be raised while a flow (expansion) of the resist liquid toward an outer periphery of the front surface Wa is suppressed. Accordingly, falling of the liquid or unnecessary supplying of the liquid due to a cut-off of the liquid can be suppressed.

The rotation controller 115 may decrease the rotation speed of the wafer W by the rotating holder 20 to the third rotation speed before the discharge of the resist liquid from the nozzle 31 is stopped, and may maintain the rotation speed of the wafer W at the third rotation speed until the nozzle 31 is distanced away from the wafer W. In this case, the stopping of the discharge of the resist liquid and the raising of the nozzle 31 can be performed in the state that the flow (expansion) of the resist liquid toward the outer periphery of the front surface Wa and the rotation speed of the wafer W is suppressed. Thus, the falling of the liquid or the unnecessary supplying of the liquid due to a cut-off of the liquid can be further suppressed.

In addition, the aforementioned coating distance may be set to be smaller than a liquid droplet of the resist liquid that can be formed by the nozzle 31. In this case, when the nozzle 31 is raised, the distance between the front surface Wa and the lower end surface 31a is changed from a state where it is smaller than the liquid droplet into a state where it is larger than the liquid droplet. That is, the distance between the front surface Wa and the lower end surface 31a is changed from a distance where the liquid droplet cannot be formed into a distance where the liquid droplet can be formed. In this case, the effect of suppressing the falling of the liquid or the unnecessary supplying of the liquid becomes more conspicuous.

In a period during which the pre-wet liquid is supplied onto the front surface Wa of the wafer W from the nozzle 41, the rotation controller 115 rotates the wafer W at a fourth rotation speed which allows the pre-wet liquid to stay on the front surface Wa. The fourth rotation speed may be equal to or less than the third rotation speed. By way of example, the fourth rotation speed may be 0 rpm to 100 rpm, 10 rpm to 70 rpm, or 20 rpm to 40 rpm.

Further, the rotation controller 115 controls the rotating holder 20 to rotate the wafer W at a fifth rotation speed such that the pre-wet liquid supplied onto the front surface Wa of the wafer W from the nozzle 41 is diffused toward the edge We of the wafer W by the centrifugal force and a surplus of the pre-wet liquid is scattered from the edge of the wafer W. The fifth rotation speed may be equal to or larger than the second rotation speed. By way of example, the fifth rotation speed may be 1000 rpm to 3000 rpm, 1500 rpm to 2500 rpm, or 1800 rpm to 2200 rpm.

The opening/closing controller 116 controls the opening/closing unit 80 to locate the cover member 81 configured to suppress volatilization of a solvent of the resist liquid at a position facing the front surface Wa before the supply of the resist liquid onto the front surface Wa of the wafer W from the nozzle 31 is stopped. By way of example, the opening/closing controller 116 controls the opening/closing unit 80 to move the cover member 81 to the aforementioned closing position by using the opening/closing driver 82 before the supply of the resist liquid onto the front surface Wa of the wafer W from the nozzle 31 is stopped. Further, the opening/closing controller 116 closes the exhaust valve 75 at the same time when the opening/closing unit 80 moves the cover member 81 to the closing position.

The opening/closing controller 116 controls the opening/closing unit 80 to remove the cover member 81 from the position facing the front surface Wa before the rotation of the wafer W at the second rotation speed is completed. By way of example, the opening/closing controller 116 controls the opening/closing unit 80 to move the cover member 81 from the closing position to the opening position by using the opening/closing driver 82 at a preset timing prior to the completion of the rotation of the wafer W at the second rotation speed. Furthermore, the opening/closing controller 116 opens the exhaust valve 75 at the same time when the opening/closing unit 80 moves the cover member to the opening position. Here, the preset timing may be set such that a period between this preset timing and a timing when the supply of the resist liquid onto the front surface Wa of the wafer W from the nozzle 31 is stopped is shorter than a period between this preset timing and a timing when the rotation of the wafer W at the second rotation speed is completed. This preset timing may be set to be a time after the supply of the resist liquid onto the front surface Wa of the wafer W from the nozzle 31 is stopped.

The cooling controller 117 controls the cooler 90 to cool the wafer W in the period during which the resist liquid is supplied onto the front surface Wa of the wafer W from the nozzle 31. By way of example, the cooling controller 117 controls the cooler 90 to supply the cooling liquid to the rear surface Wb of the wafer W from the nozzle 91 in the period during which the resist liquid is supplied onto the front surface Wa of the wafer W from the nozzle 31. As a result, the aforementioned annular region of the wafer W is cooled. The cooling controller 117 controls the cooler 90 to stop the cooling of the wafer W before the rotation of the wafer W at the second rotation speed is completed. The cooling controller 117 controls the cooler 90 to stop the discharge of the cooling liquid from the nozzle 91 at a predetermined timing before the rotation of the wafer W at the second rotation speed is completed. Here, the predetermined timing may be set such that a period between this predetermined timing and the timing when the supply of the resist liquid onto the front surface Wa of the wafer W from the nozzle 31 is stopped is shorter than a period between this predetermined timing and the timing when the rotation of the wafer W at the second rotation speed is completed. This predetermined timing may be set to be a time after the supply of the resist liquid onto the front surface Wa of the wafer W from the nozzle 31 is stopped. A cooling effect for the wafer W is continued during a certain period even after the cooling of the wafer W by the cooler 90 is stopped. In consideration of this, the predetermined timing may be set to be a time before the supply of the resist liquid onto the front surface Wa of the wafer W from the nozzle 31 is stopped.

Figure 4:
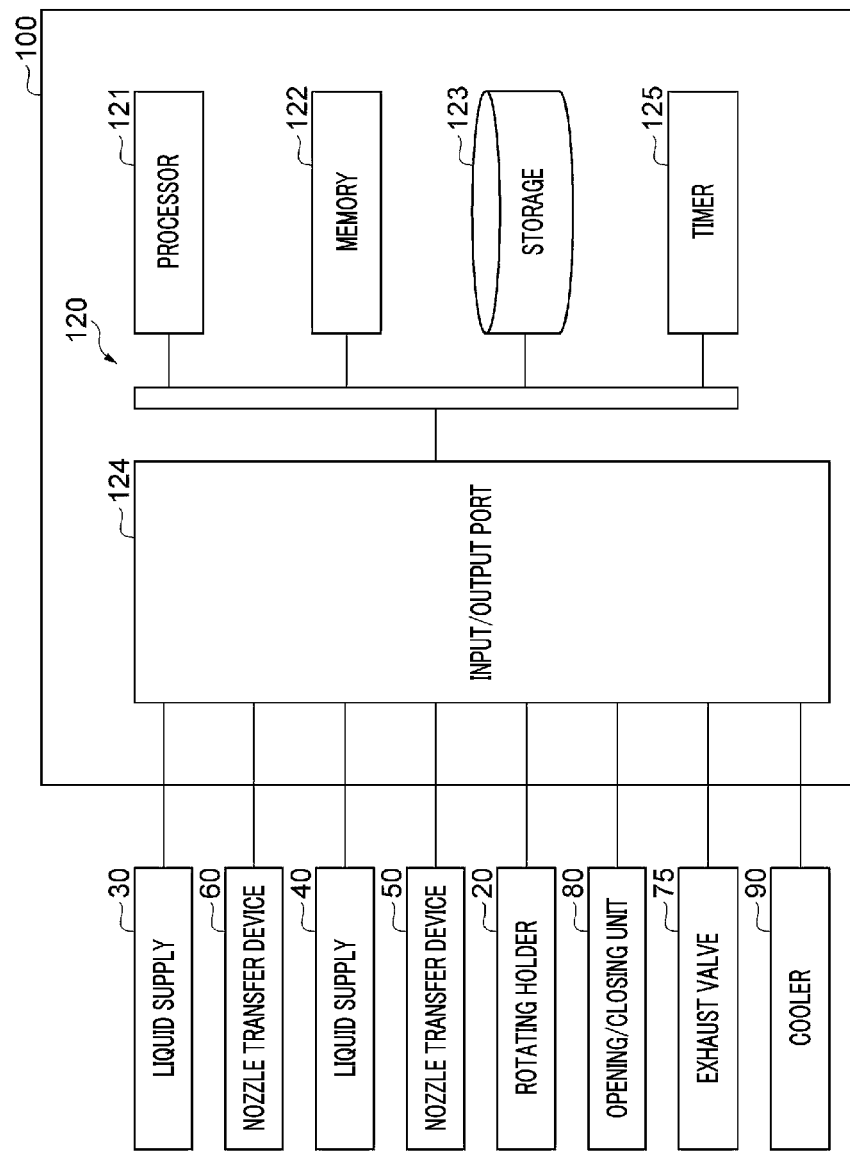
FIG. 4 is a block diagram illustrating a hardware configuration of the controller.

The controller 100 is composed of, by way of example, one or more control computers. For example, the controller 100 has a circuit 120 shown in FIG. 4. The circuit 120 is equipped with one or more processors 121, a memory 122, a storage 123, an input/output port 124 and a timer 125. The storage 123 has a computer-readable recording medium such as, but not limited, a hard disk. The storage 123 stores therein programs that cause the controller 100 to control the liquid supply 30 and the nozzle transfer device 50 to supply the resist liquid onto the center of the front surface Wa of the wafer W from the nozzle 31 in the state that the distance between the front surface Wa of the wafer W and the nozzle 31 is maintained at the preset coating distance; and control the rotating holder 20 to rotate the wafer W at the first rotation speed around the axis Ax1 passing through the center of the front surface Wa of the wafer W in the period during which the resist liquid is supplied onto the front surface Wa of the wafer W from the nozzle 31, thus allowing the resist liquid to be diffused to the edge We of the wafer W from the outer periphery of the nozzle 31 by the centrifugal force, and rotate the wafer W around the axis Ax1 at the second rotation speed after the supply of the resist liquid onto the front surface Wa of the wafer W from the nozzle 31 is stopped, thus allowing the resist liquid to be further diffused by the centrifugal force. By way of example, the storage 123 may store therein programs for constituting the above-described individual functional modules of the controller 100 by the controller 100.

The memory 122 is configured to temporarily store thereon the programs loaded form the recording medium of the storage 123 and operation results by the processor 121. The processor 121 executes the programs in cooperation with the memory 122, thus constituting the above-described individual functional modules. The input/output port 124 is configured to perform an input/output of an electric signal among the rotating holder 20, the liquid supply 30, the liquid supply 40, the nozzle transfer device 50, the nozzle transfer device 60, the exhaust valve 75, the opening/closing valve 80 and the cooler 90 in response to an instruction from the processor 121. The timer 125 is configured to measure an elapsed time by counting, for example, a reference pulse of a preset cycle.

Further, the hardware configuration of the controller 100 is not limited to constituting the individual functional modules by the programs. By way of example, each functional module of the controller 100 may be implemented by a dedicated logical circuit or an ASIC (Application Specific Integrated Circuit) which is an integration of the logical circuits.

[Coating Sequence]

Now, a coating sequence performed by the coating unit U1 will be elaborated as an example of a coating method. This coating sequence includes: supplying the resist liquid onto the center of the front surface Wa of the wafer W from the nozzle 31 in the state that the distance between the front surface Wa and the nozzle 31 is maintained at the coating distance; rotating the wafer W at the first rotation speed around the axis Ax1, which passes through the center of the front surface Wa, in the period during which the resist liquid is supplied onto the front surface Wa from the nozzle 31, thus allowing the resist liquid to be diffused to the edge We of the wafer W from the outer periphery of the nozzle 31 by the centrifugal force; and rotating the wafer W around the axis Ax1 at the second rotation speed after the supply of the resist liquid onto the front surface Wa from the nozzle 31 is sopped, thus allowing the resist liquid to be further diffused by the centrifugal force.

Figure 5:
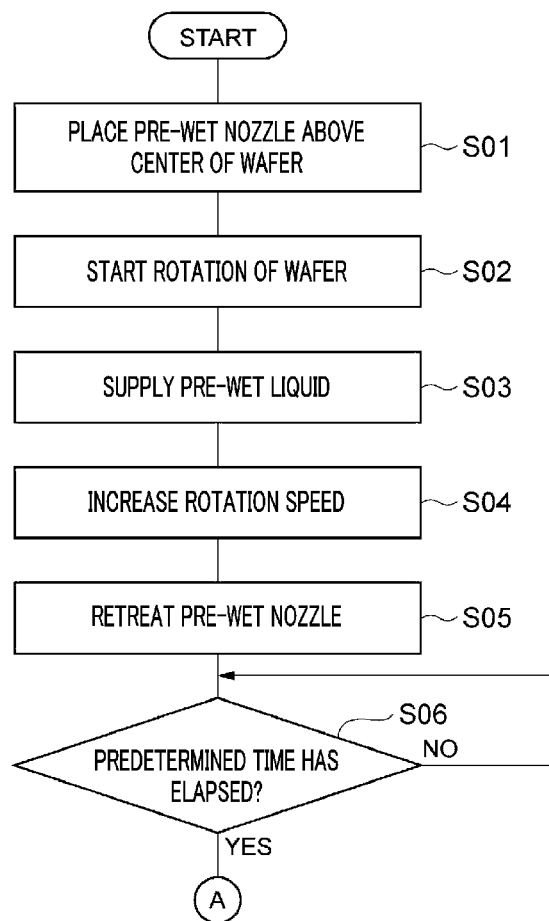
FIG. 5 is a flowchart illustrating a coating sequence.

By way of example, the controller 100 first performs processes S01, S02 and S03, as shown in FIG. 5. In the process S01, the nozzle transfer controller 113 controls the nozzle transfer device 60 to locate the nozzle 41 at the position above the center of the wafer W by using the horizontal transfer unit 61. Then, the nozzle transfer controller 113 controls the nozzle transfer device 60 to move the nozzle 41 close to the front surface Wa by using the elevating unit 62 (see FIG. 8A). In the process S02, the rotation controller 115 controls the rotating holder 20 to start rotating the wafer W at the fourth rotation speed. In the process S03, the liquid supply controller 112 controls the liquid supply 40 to supply a preset amount of the pre-wet liquid onto the front surface Wa of the wafer W (see FIG. 8B).

Subsequently, the controller 100 performs processes S04, S05 and S06. In the process S04, the rotation controller 115 controls the rotating holder 20 to increase the rotation speed of the wafer W from the fourth rotation speed to the fifth rotation speed. Accordingly, the pre-wet liquid supplied onto the front surface Wa of the wafer W from the nozzle 41 is diffused to the edge Wc of the wafer W by the centrifugal force, and the surplus of the pre-wet liquid is scattered from the edge of the wafer W (see FIG. 8C). In the process S05, the nozzle transfer controller 113 controls the nozzle transfer device 60 to move the nozzle 41 away from the front surface Wa by using the elevating unit 62 and retreat the nozzle 41 from above the wafer W by using the horizontal transfer unit 61. In the process S06, the rotation controller 115 stands by until a predetermined time elapses from a timing when the rotation of the wafer W at the fifth rotation speed is begun. Here, the predetermined time is set through a previous test or simulation to allow the surplus of the pre-wet liquid to be scattered sufficiently.

Figure 6:
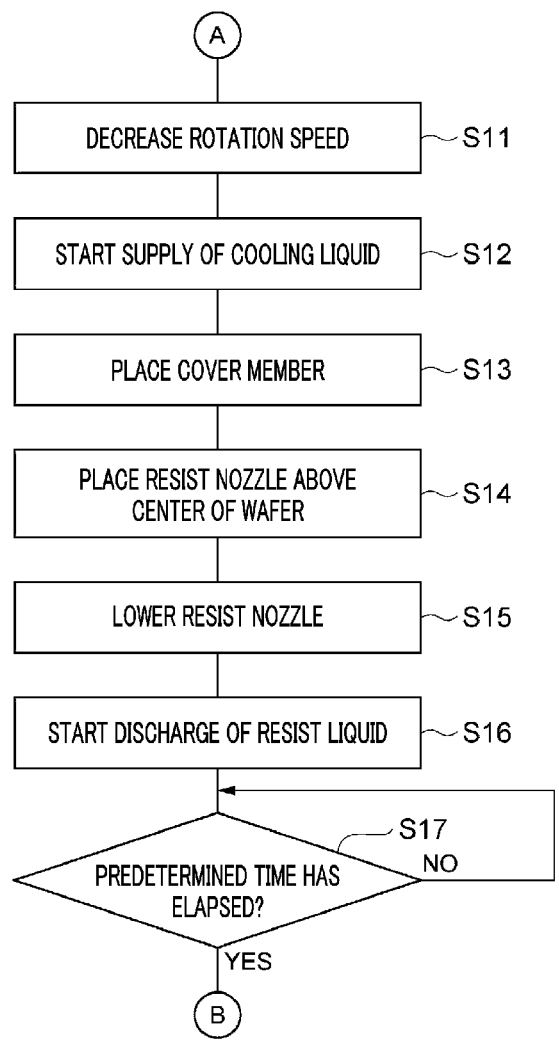
FIG. 6 is a flowchart illustrating the coating sequence.
Figure 9A:
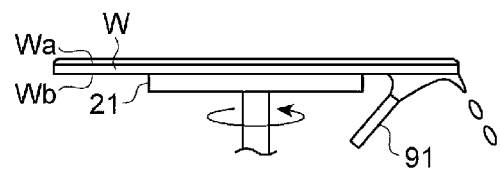
FIG. 9A and FIG. 9B are schematic diagrams illustrating states of the wafer when cooling is begun and a cover is closed.
Figure 9B:
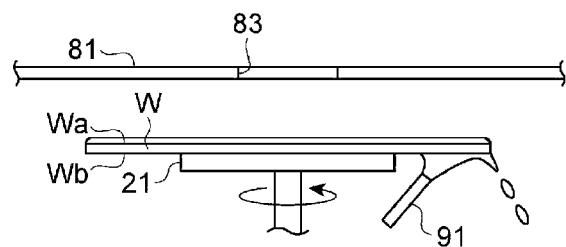

Thereafter, the controller 100 performs processes S11, S12 and S13, as shown in FIG. 6. In the process S11, the rotation controller 115 controls the rotating holder 20 to decrease the rotation speed of the wafer W from the fifth rotation speed to the first rotation speed. In the process S12, the cooling controller 117 controls the cooler 90 to start supplying the cooling liquid to the rear surface Wb of the wafer W from the nozzle 91 (see FIG. 9A). In the process S13, the opening/closing controller 116 controls the opening/closing unit 80 to move the cover member 81 to the aforementioned closing position (the position facing the front surface Wa) by using the opening/closing driver 82 (see FIG. 9B). Further, in the process S13, the opening/closing controller 116 closes the exhaust valve 75.

Figure 10A:
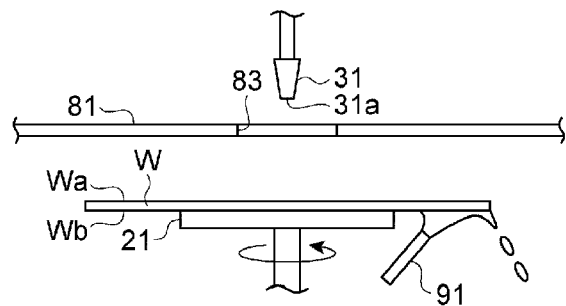
FIG. 10A to FIG. 10C are schematic diagrams illustrating states of the wafer during a supply of a resist liquid.
Figure 10B:
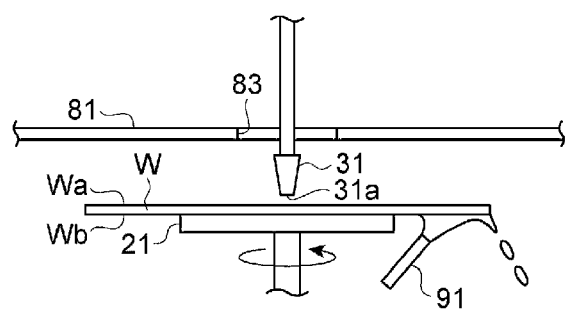
Figure 10C:
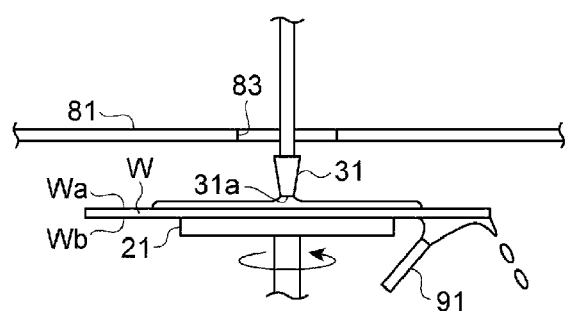

Subsequently, the controller 100 performs processes S14, S15, S16 and S17. In the process S14, the nozzle transfer controller 114 controls the nozzle transfer device 50 to place the nozzle 31 at the position above the center of the wafer W by using the horizontal transfer unit 51 (see FIG. 10A). In the process S15, the nozzle transfer controller 114 controls the nozzle transfer device 50 to move the nozzle 31 close to the front surface Wa by using the elevating unit 52 until the distance between the front surface Wa and the nozzle 31 becomes the aforementioned coating distance (see FIG. 10B). In the process S16, the liquid supply controller 111 controls the liquid supply 30 to start the supply of the resist liquid onto the front surface Wa of the wafer W from the nozzle 31 in the state that the distance between the front surface Wa and the nozzle 31 is maintained at the aforementioned coating distance (see FIG. 10C). In the process S17, the liquid supply controller 111 stands by until a predetermined time elapses from the timing when the discharge of the resist liquid from the nozzle 31 is begun. The predetermined time is set through a previous test or simulation to supply the resist liquid in a sufficient amount to achieve a target film thickness of the resist film.

Figure 7:
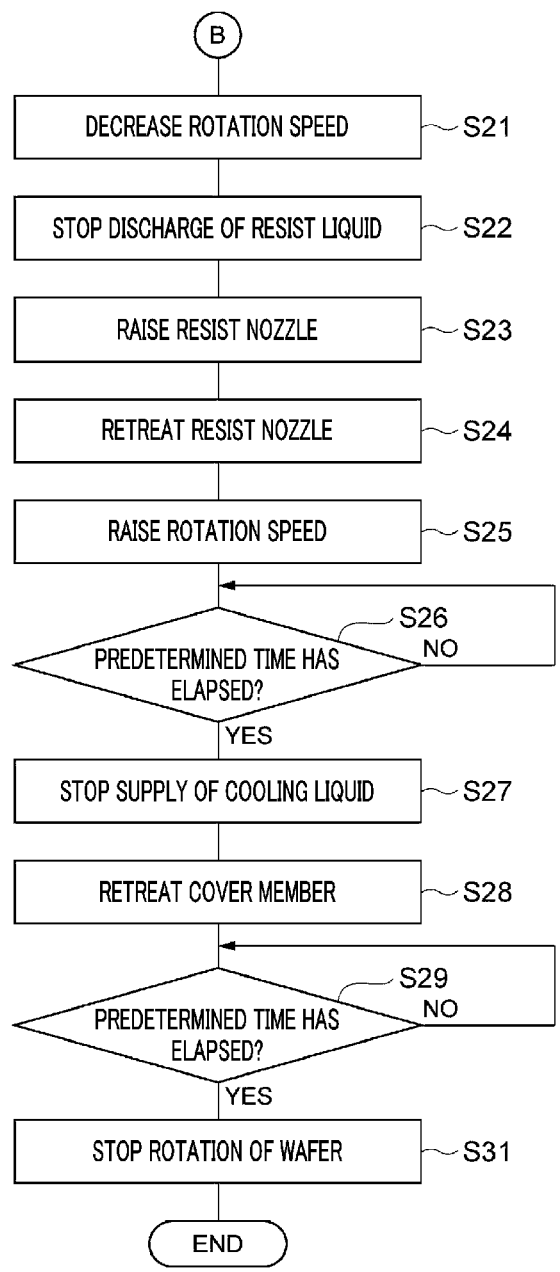
FIG. 7 is a flowchart illustrating the coating sequence.
Figure 11A:
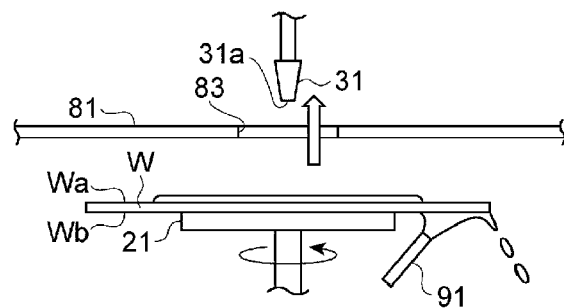
FIG. 11A to FIG. 11C are schematic diagrams illustrating states of the wafer when the supply of the resist liquid is stopped and the resist liquid is diffused.

Then, the controller 100 performs processes S21, S22, S23 and S24 as shown in FIG. 7. In the process S21, the rotation controller 115 controls the rotating holder 20 to decrease the rotation speed of the wafer W from the first rotation speed to the third rotation speed. In the process S22, the liquid supply controller 111 controls the liquid supply 30 to stop the discharge of the resist liquid from the nozzle 31. In the process S23, the nozzle transfer controller 114 controls the nozzle transfer device 50 to move the nozzle 31 away from the front surface Wa by using the elevating unit 52 (see FIG. 11A). In the process S24, the nozzle transfer controller 114 controls the nozzle transfer device 50 to retreat the nozzle 31 from above the wafer W by using the horizontal transfer unit 51.

Figure 11B:
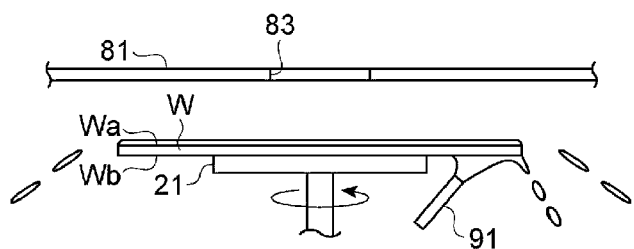

Subsequently, the controller 100 performs processes S25 and S26. In the process S25, the rotation controller 115 controls the rotating holder 20 to increase the rotation speed of the wafer W from the third rotation speed to the second rotation speed. Accordingly, the resist liquid on the front surface Wa is further diffused to the edge Wc, and the surplus of the resist liquid is scattered off the front surface Wa (see FIG. 11B). In the process S26, the rotation controller 115 stands by until a predetermined time elapses from the timing when the rotation of the wafer W at the second rotation speed is begun. This predetermined time is set through a previous test or simulation to improve uniformity of the film thickness of the resist film.

Figure 11C:
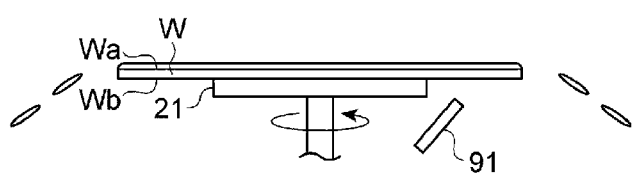

Afterwards, the controller 100 performs processes S27, S28, S29 and S31. In the process S27, the cooling controller 117 controls the cooler 90 to stop the supply of the cooling liquid to the rear surface Wb of the wafer W from the nozzle 91. In the process S28, the opening/closing controller 116 controls the opening/closing unit 80 to move the cover member 81 to the opening position from the closing position by using the opening/closing driver 82 (see FIG. 11C). Further, in the process S28, the opening/closing controller 116 opens the exhaust valve 75. In the process S29, the rotation controller 115 stands by until a predetermined time elapses from the timing when the rotation of the wafer W at the second rotation speed is begun. In the meanwhile, the diffusion of the resist liquid toward the edge Wc is continued. The predetermined time is set through a previous test or simulation to improve the uniformity of the film thickness of the resist film. In the process S31, the rotation controller 115 controls the rotating holder 20 to stop the rotation of the wafer W. Through these processes, the coating sequence is completed.

[Effects of Present Exemplary Embodiment]

As described above, the coating method according to the present exemplary embodiment includes: supplying the resist liquid onto the center of the front surface Wa of the wafer W from the nozzle 31 in the state that the distance between the front surface Wa of the wafer W and the nozzle 31 is maintained at the coating distance; rotating the wafer W at the first rotation speed around the axis Ax1, which passes through the center of the front surface Wa of the wafer W, in the period during which the resist liquid is supplied onto the front surface Wa of the wafer W from the nozzle 31, thus allowing the resist liquid to be diffused to the edge Wc of the wafer W from the outer periphery of the nozzle 31 by the centrifugal force; and rotating the wafer W around the axis Ax1 at the second rotation speed after the supply of the resist liquid onto the front surface Wa of the wafer W from the nozzle 31 is sopped, thus allowing the resist liquid to be further diffused by the centrifugal force. The coating distance is set to allow the resist liquid to be kept between the nozzle 31 and the front surface Wa of the wafer W when the discharge of the resist liquid from the nozzle 31 is stopped.

Drying of the resist liquid progresses during a period until the resist liquid reaches the edge Wc of the wafer W after being discharged from the nozzle 31. If the drying of the resist liquid progresses up to a level where fluidity is substantially reduced before the resist liquid reaches the edge Wc of the wafer W, uniformity of the film thickness of the film formed by the coating of the resist liquid may be degraded. By way of example, since the resist liquid may not be sufficiently diffused to the edge Wc of the wafer W, the film thickness at the peripheral portion of the wafer W may become excessively small. Meanwhile, the film thickness may become excessively large between the center of the wafer W and the edge Wc thereof. As a resolution, by supplying the resist liquid in the state that the nozzle 31 is placed close to the wafer W with the aforementioned coating distance therebetween (hereinafter, referred to as "proximity coating"), the drying of the resist liquid is suppressed at least until the resist liquid reaches the edge Wc of the wafer W from the nozzle 31. Therefore, the reduction of the fluidity of the resist liquid before the arrival of the resist liquid at the edge Wc of the wafer W can be suppressed, so that the uniformity of the film thickness can be improved.

The coating method may further include: coating the pre-wet liquid on the front surface Wa of the wafer W before the resist liquid is supplied onto the front surface Wa of the wafer W from the nozzle 31; and, after the coating of the pre-wet liquid, moving the nozzle 31 close to the front surface Wa of the wafer W until the distance between the front surface Wa of the wafer W and the nozzle 31 becomes the coating distance. In this case, due to the effect of facilitating the diffusion of the resist liquid by the coating of the pre-wet liquid and the effect of further suppressing the reduction of the fluidity of the resist liquid by the proximity coating, the reduction of the fluidity of the resist liquid before the arrival of the resist liquid at the edge Wc of the wafer W can be further suppressed. Thus, the uniformity of the film thickness can be further improved.

The discharge of the resist liquid from the nozzle 31 may be stopped before the resist liquid reaches the edge Wc of the wafer W. In this case, it is possible to achieve the uniformity of the film thickness while saving the resist liquid.

When the resist liquid is supplied to the center of the front surface Wa of the wafer W from the nozzle 31, the resist liquid having the viscosity equal to or less than 5 cP may be discharged from the nozzle 31 at the flow rate of 0.2 cc or less per second. In this case as well, it is possible to achieve the uniformity of the film thickness while saving the resist liquid.

The coating distance may be equal to or less than three times the inner diameter ID1 of the nozzle 31. In this case, the proximity coating can be carried out more securely. Furthermore, the coating distance may be set to be of a value larger than the film thickness of the liquid film. In such a case, the adhesion region of the resist liquid with respect to the liquid film can be reduced, so that physical interference between the liquid film and the nozzle 31 can be suppressed. Furthermore, the resist liquid can be suppressed from being left at the nozzle 31 after the cut-off of the liquid (rising of the nozzle 31). Therefore, the uniformity of the film thickness can be further improved.

The coating method may further include: placing the cover member 81 for suppressing volatilization of the solvent of the resist liquid at the position facing the front surface Wa of the wafer W before the supply of the resist liquid onto the front surface Wa of the wafer W from the nozzle 31 is stopped; and removing the cover member 81 from the position facing the front surface Wa of the wafer W before the rotation of the wafer W at the second rotation speed is completed. In this case, due to the effect of suppressing the volatilization of the solvent by the cover member 81 and the effect of further suppressing the reduction of the fluidity of the resist liquid by the proximity coating, the reduction of the fluidity of the resist liquid before the arrival of the resist liquid at the edge Wc of the wafer W can be further suppressed.

The coating method may further include: cooling the wafer W in the period during which the resist liquid is supplied onto the front surface Wa of the wafer W from the nozzle 31; and stopping the cooling of the wafer W before the rotation of the wafer W at the second rotation speed is completed. In this case, due to the effect of suppressing the volatilization of the solvent by the cooling of the wafer W and the effect of further suppressing the reduction of the fluidity of the resist liquid by the proximity coating, the reduction of the fluidity of the resist liquid before the arrival of the resist liquid at the edge Wc of the wafer W can be further suppressed.

The cooling of the wafer W may be stopped at a timing which is set such that a period between this timing and the timing when the supply of the resist liquid onto the front surface Wa of the wafer W from the nozzle 31 is stopped is shorter than a period between this timing and the timing when the rotation of the wafer W at the second rotation speed is completed. If the cooling of the wafer W is carried out excessively during the rotation of the wafer W at the second rotation speed, the amount of the resist liquid scattered from the wafer W after being supplied becomes excessively large, so that the film thickness may become excessively small. However, by stopping the cooling of the wafer W at the aforementioned timing, the film thickness can be optimized.

When rotating the wafer W, the wafer W may be rotated while being held by the rotating holder 20 from the rear surface Wb side thereof, and when cooling the wafer W, the annular region of the wafer W at the outer side than the region of the wafer W held by the rotating holder 20 may be cooled. In this case, since a region of the wafer W inside the annular region is not cooled, a more conspicuous effect of the proximity coating can be obtained.

When cooling the wafer W, the cooling liquid may be supplied to the rear surface Wb of the wafer W. In this case, a configuration for cooling the wafer W can be simplified.

So far, the exemplary embodiments have been described. However, the present disclosure is not necessarily limited to the above-described exemplary embodiments, and various changes and modifications may be made without departing from the scope of the present disclosure. Within a range facing the front surface Wa of the wafer W, the cover member 81 may have, around the nozzle insertion opening 83, another opening which is different from the nozzle insertion opening 83. Hereinafter, this opening will be referred to as "additional opening". At a position of the front surface Wa facing a region of the additional opening, it is difficult to suppress volatilization of the solvent. As a result, the film thickness of the resist film tends to be thickened at this position facing the region of the additional opening. This feature may be used to improve the uniformity of the film thickness. By way of example, the additional opening may be formed to correspond to a portion of the wafer W where the film thickness is not enough, and the film thickness at the corresponding portion can be increased. Further, the additional opening may be moved by the opening/closing driver 82 in the period during which the resist liquid is diffused.

The cover member 81 may be moved by the nozzle transfer device 50 along with the nozzle 31. In this configuration, the opening/closing driver 82 may be omitted. The above-described coating method is also applicable to formation of various other kinds of films (for example, the aforementioned bottom film or top film) other than the resist film. The substrate as the processing target is not limited to the semiconductor wafer, and may be a glass substrate, a mask substrate, a FPD (Flat Patent Display), or the like.

According to the exemplary embodiment, it is possible to provide the coating method which is advantageous to improve uniformity of a film thickness.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A coating method, comprising:
supplying a film forming liquid onto a front surface of a substrate from a nozzle in a state that a distance between the front surface of the substrate and a lower end of the nozzle is maintained at a coating distance; and
diffusing the film forming liquid supplied from the nozzle toward an edge of the substrate by rotating the substrate,
wherein the coating distance is larger than a thickness of an outer periphery region of a film of the film forming liquid, the outer periphery region is a region other than directly below the lower end of the nozzle,
wherein the coating distance is set to allow the film forming liquid to stay between a lower end surface of the nozzle and the front surface of the substrate in a state that both the lower end surface of the nozzle and the front surface of the substrate are in contact with the film forming liquid when a discharge of the film forming liquid from the nozzle is stopped.

2. The coating method of claim 1, further comprising:
coating a pre-wet liquid onto the front surface of the substrate before the supplying of the film forming liquid onto the front surface of the substrate from the nozzle; and
moving, after the coating of the pre-wet liquid, the nozzle close to the front surface of the substrate.

3. The coating method of claim 1,
wherein when the film forming liquid is supplied onto the front surface of the substrate from the nozzle, the film forming liquid having a viscosity equal to or less than 5 cP is discharged from the nozzle at a flow rate equal to or less than 0.2 cc per second.

4. The coating method of claim 1, further comprising:
cooling the substrate in a period during which the film forming liquid is supplied onto the front surface of the substrate from the nozzle; and
stopping the cooling of the substrate before the rotating of the substrate is stopped.

5. A coating method, comprising:
supplying a film forming liquid onto a front surface of a substrate from a nozzle in a state that a distance between the front surface of the substrate and a lower end of the nozzle is maintained at a coating distance;
diffusing the film forming liquid supplied from the nozzle toward an edge of the substrate by rotating the substrate; and
cooling the substrate by supplying a cooling fluid to a rear surface of the substrate in a period during which the film forming liquid is supplied onto the front surface of the substrate from the nozzle and diffused toward the edge.

* * * * *

UNITED STATES PATENT AND TRADEMARK OFFICE
CERTIFICATE OF CORRECTION

PATENT NO. : 11,938,511 B2
APPLICATION NO. : 17/809947
DATED : March 26, 2024
INVENTOR(S) : Masatoshi Kawakita et al.

It is certified that error appears in the above-identified patent and that said Letters Patent is hereby corrected as shown below:

In the Specification

Column 8, Line 55, "We" should be -- Wc --.

Column 10, Line 52, "We" should be -- Wc --.

Column 12, Line 7, "We" should be -- Wc --.

Column 12, Line 49, "We" should be -- Wc --.

Column 13, Line 10, "We" should be -- Wc --.

Column 16, Line 4, "wafer Win the period" should be -- wafer W in the period --.

Signed and Sealed this
Twenty-ninth Day of October, 2024

Katherine Kelly Vidal
*Director of the United States Patent and Trademark Office*